United States Patent [19]
Hikita

[11] Patent Number: 4,492,940
[45] Date of Patent: Jan. 8, 1985

[54] ACOUSTIC SURFACE-WAVE BANDPASS FILTER

[75] Inventor: Mitsutaka Hikita, Hachioji, Japan

[73] Assignee: Hitachi, Ltd., Tokyo, Japan

[21] Appl. No.: 463,959

[22] Filed: Feb. 4, 1983

[30] Foreign Application Priority Data

Mar. 10, 1982 [JP] Japan .................................. 57-36410

[51] Int. Cl.³ ...................... H03H 9/64; H03H 9/145
[52] U.S. Cl. .................... 333/194; 310/313 B; 333/195; 333/196
[58] Field of Search ........................... 333/150–155, 333/193–196; 310/313 R, 313 A, 313 B, 313 C, 313 D; 331/107 A

[56] References Cited

U.S. PATENT DOCUMENTS 3,582,840  6/1971  De Vries .
4,143,343  3/1979  Inoue et al. ...................... 333/194

*Primary Examiner*—Marvin L. Nussbaum
*Attorney, Agent, or Firm*—Antonelli, Terry & Wands

[57] ABSTRACT

An acoustic surface-wave bandpass filter includes a substrate made of a piezoelectric material. Acoustic surface waves travelling on a substrate surface provided with electrically conductive narrow stripes, slits or grooves undergo interference, wherein acoustic surface waves excited at frequency in VHF and UHF range are taken out as electric signals. The number of interleaved fingers constituting input transducers and output transducers of the filter is selected greater for the transducer located at the center than those disposed at both end portions. Leakage of acoustic surface-wave energy from the end transducers can be remarkably reduced, while the number of the transducers constituting the filter can be decreased. Significant reduction of loss of the filter is thus attained.

5 Claims, 5 Drawing Figures

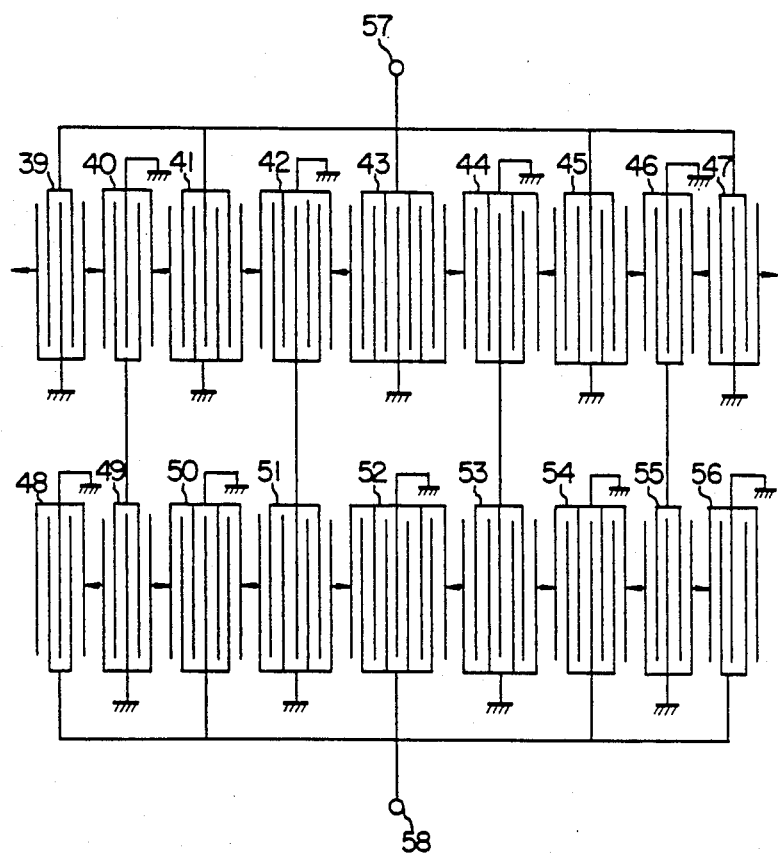

ACOUSTIC SURFACE-WAVE BANDPASS FILTER

The present invention generally relates to an acoustic surface-wave bandpass filter with interdigital electrodes and in particular to an improved structure of the acoustic surface-wave bandpass filter in which acoustic surface waves travelling along a surface of a substrate made of a piezoelectric material is subjected to interference with electrically conductive narrow metal stripes, slits or grooves formed in the substrate surface to thereby cause the bandpass filter to be operated in VHF/UHF frequency ranges.

As a filter cirucit destined to be used in frequency ranges of VHF and UHF, there has been developed filters in which acoustic surface waves are made use of and which are replacing the hitherto known LC filters implemented by capacitors and inductors. However, the acoustic surface-wave filter suffers a problem that leakage loss of the acoustic surface-wave travelling from input transducer to output transducer is significant. Thus, there exists a demand for a structure of the acoustic surface-wave filter in which the loss due to the leakage can be reduced to a possible minimum. As an acoustic surface-wave filter which allows the loss to be reduced, there is known a structure in which input transducers $1, 3, 5, \ldots, 11$ and output transducers $2, 4, \ldots, 12$ of interdigital configuration are alternately disposed in a lateral or wave-travelling direction in a similar pattern repeated a number of times, as is shown in FIG. 1 of the accompanying drawings. For example, reference may be made to U.S. Pat. No. 3,582,840 issued to A. J. DeVries on June 1, 1971. Numerals 13 and 14 denote input and output terminals, respectively. With this structure, all the acoustic surface waves excited by the input transducers reaches to the corresponding output transducers except for those disposed at both ends of the repeated array, as indicated by arrows. Thus, the aimed reduction of leakage loss can be attained to a certain degree.

However, experimental study conducted by the inventor of the present application has shown that the acoustic surface-wave bandpass filter of the structure described above still suffers a problem in that the degree of improvement on the loss due to leakage of the acoustic surface wave at both the end transducers remains unsatisfactory notwithstanding a considerably increased number of the transducers arrayed in the repetition pattern. Results of calculations made in this connection are graphically illustrated in FIG. 2 in which the number of the tranducers arrayed in repetition is taken along the abscissa, while loss is taken in the ordinate. As will be seen from FIG. 2, the number of the transducers will amount to more than 20, in order to reduce the loss to less than 0.5 dB, way of example.

In practical applications of the filter structure shown in FIG. 1, limitation is inevitably imposed on the permissible number of the transducers which is actually very small, because the increased number of the transducers involves a correspondingly increased chip size and lowered input and output impedances. This is of course a disadvantage of the prior art acoustic surface-wave filter shown in FIG. 1.

It is an object of the present invention to provide an acoustic surface-wave filter in which the problems of the prior art described above are eliminated and in which the number of the input and output transducers arrayed in repetition can be decreased while the loss due to leakage being reduced so that the frequency characteristic of the filter may be protected from adverse influence of the leakage loss.

In view of the above and other objects which will be more apparent as description proceeds, there is proposed according to an aspect of the present invention an acoustic surface-wave bandpass filter in which input and/or output transducers each composed of a large number of interleaved metal electrodes or fingers are disposed on a substrate of a piezoelectric material at a center portion of the filter, while the number of fingers which constitute the transducers to be disposed at the portions on both sides of the center portion of the filter is decreased compared to the center portion. In other words, in terms of the number of interleaved metal electrodes, taper is introduced in the number of the fingers constituting the individual transducers as viewed in the direction from the center toward either end of the transducer array. With such structure of the surface-wave bandpass filter as described above, acoustic surface waves having greater amplitude travel from input transducers to output transducers at the center portion of the transducer array, while acoustic surface-waves of smaller amplitudes travel from input transducers to output transducers at the portions on both sides of the center portion of the transducer array, whereby the leakage of acoustic suface-wave energy at both ends or end portions of the transducer array is significantly reduced.

The present invention will be more fully understood from the following description taken in conjunction with the drawings, in which:

FIG. 5 is a view showing an arrangement of the acoustic surface-wave bandpass filter according to another embodiment of the present invention.

Figure 3:
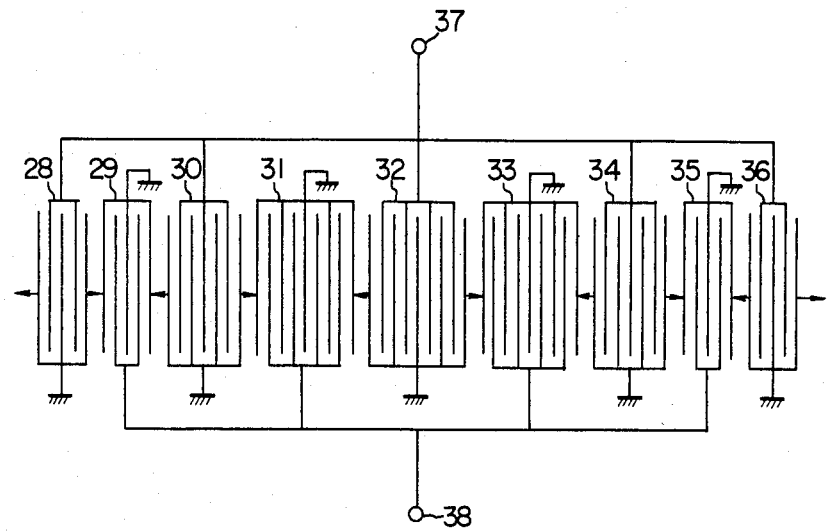
FIG. 3 is a view showing an arrangement of an acoustic surface-wave bandpass filter according to an embodiment of the present invention.

Now, the invention will be described by first referring to FIG. 3 which shows an arrangement of the acoustic surface-wave bandpass filer according to a preferred embodiment of the present invention, in which nine individual transducers 28 to 36 are juxtaposed in a wave-travelling direction. Numerals 37 and 38 denote input and output terminals, respectively. Referring to the figure, it is assumed that the numbers of metal electrodes or fingers constituting input transducers 28, 30, 32, 34 and 36 electrically connected with each other are represented by $N_1, N_2, N_3, N_4$ and $N_5$, respectively, while the numbers of the fingers constituting output transducers 29, 31, 33 and 35 electrically connected with each other are represented by $M_1, M_2, M_3$ and $M_4$, respectively. Next, introduction of tapering in the number of the metal electrodes or the fingers constituting the individual input transducers will be elucidated in concrete. The numbers of the fingers $N_1, \ldots, N_5$ are determined such that the number $N_3$ of the fingers which constitute the center input transducer 32 is the greatest, while the finger numbers $N_2$ and $N_4$ are equal to or smaller than $N_3$ with the numbers $N_1$ and $N_5$ being equal to or smaller than $N_2$ and $N_4$, i.e. $N_3 \geq N_2$ (and $N_4$) $\geq N_1$ (and $N_5$). With this arrangement of the surface-wave filter, acoustic waves having relatively large amplitudes are excited through the transducer located at or in the vicinity of the center or center portion of the transducer array, while the acoustic surface waves or relatively smaller amplitude are excited through those transducers located at the portions on both sides of the center portions of the array including at end portions or near both ends of the transducer array, whereby the acoustic surface-wave leakage occurring at the end transducers can be correspondingly reduced. In consideration of the fact that only a half of the acoustic surface waves excited through each end transducer 28 or 36 is lost according to the first order approximation, it can be said that the leakage loss is significantly reduced by imparting the taper to the numbers of the fingers as described above, although reduction of leakage loss depends on the profile of the taper actually applied.

Figure 1:
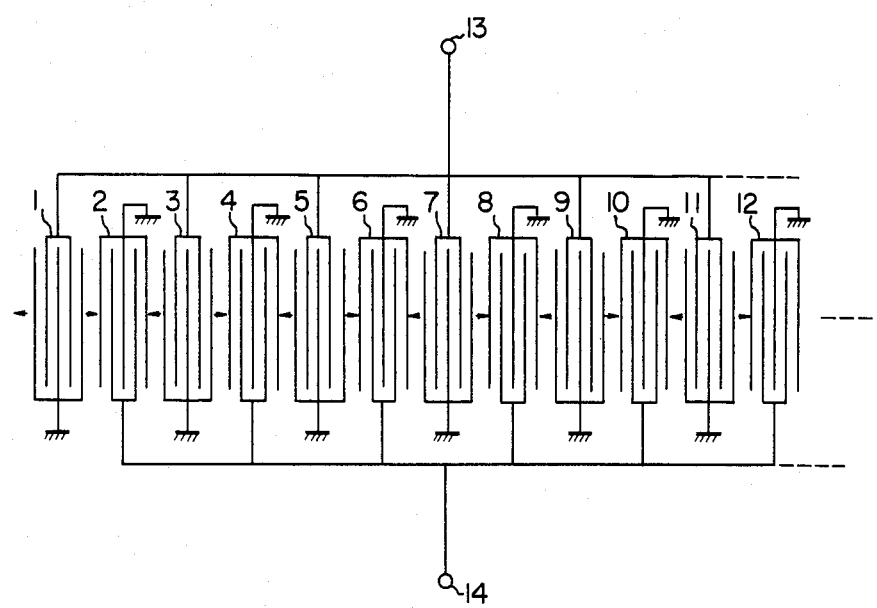
FIG. 1 is a view illustrating an arrangement of a hitherto known acoustic surface-wave bandpass filter of a repeated transducer array type.
Figure 2:
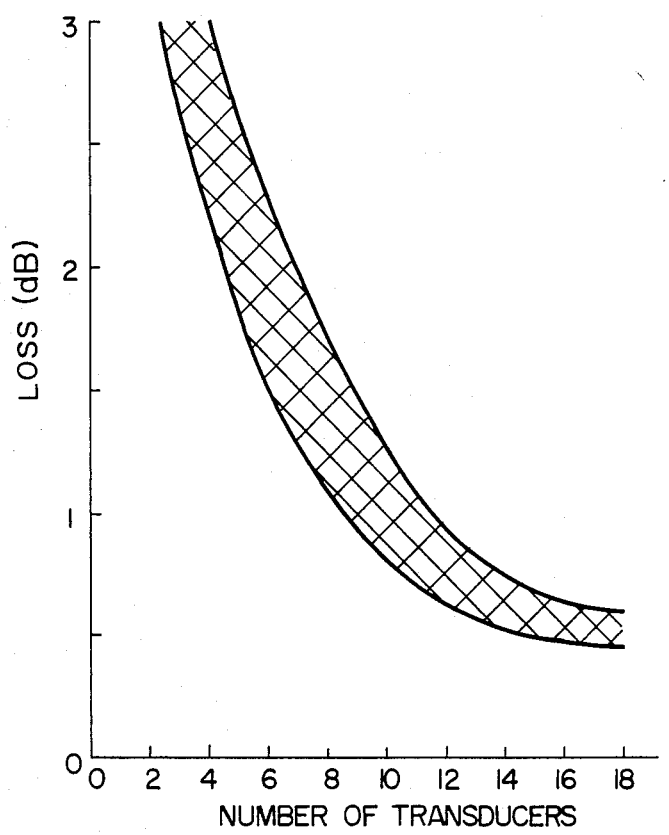
FIG. 2 is a view for graphically illustrating loss of the filter structure shown in FIG. 1 as a function of the number of the transducers.
Figure 4:
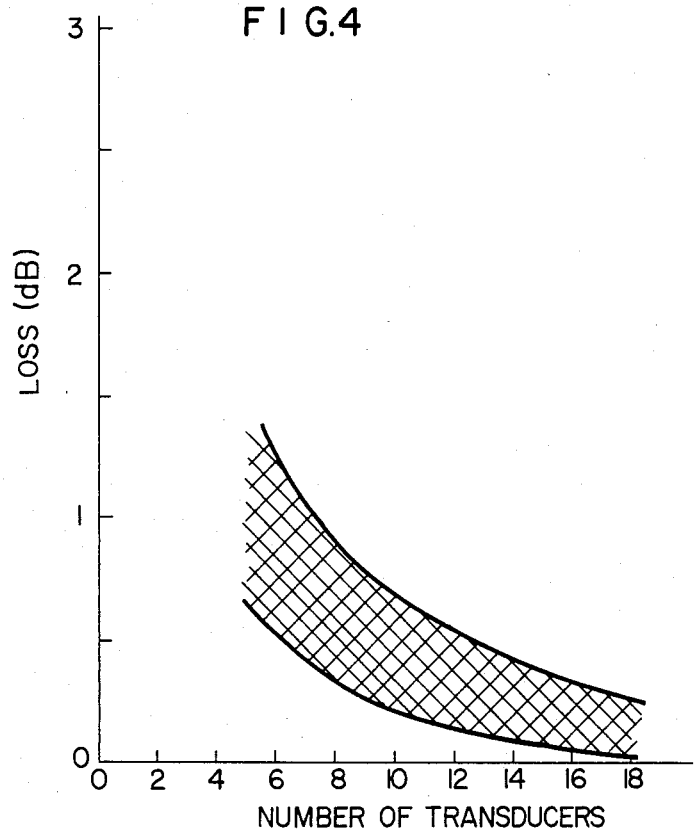
FIG. 4 is a view for graphically illustrating a relationship between loss and the number of the transducers in filter structures in which taper is introduced in respect of the number of the fingers constituting individual transducers.

Here, a most simplified example of the filters according to the invention will be considered in which a taper is introduced for the finger numbers. Namely, the number of the fingers constituting each end transducer in the filters is a half of that of the fingers constituting the other transducers, and the numbers of the juxtaposed transducers are the same as those of the filters the loss in which is illustrated in FIG. 2. The result of calculation of the leakage loss on the above assumption is graphically given in FIG. 4. When compared with FIG. 2, it will be readily understood that the leakage loss in question can be remarkably reduced by imparting the simplest tapered profile to the number of the interleaved fingers as described above.

The tapering in the number of the interleaved metal electrodes of fingers may of course be imparted not only to the input transducers but also to the output transducers 29, 31, 33 and 35, to more advantageous effect. In the latter case, the numbers $M_1$, $M_2$, $M_3$ and $M_4$ of the fingers may so determined that $M_2$ (and $M_3$)$\geq M_1$ (and $M_4$). It should also be understood that the taper may be such that the finger numbers for the transducers decrease monotonically from the center portions to the end portions of the filter.

Further, the teachings of the present invention may equally be applied to the acoustic surface-wave filter which is provided with reflectors at both ends, respectively. In that case, the leakage loss can be far more reduced due to the reciprocal effect of the reflectors.

Furthermore, the present invention can be applied not only to the acoustic surface-wave filter in which the input and the output transducers are operated in parallel as described hereinbefore but also to the filter in which the transducers are operated in series or in combinations of both modes. Further, the invention can be equally applied to the filter arrangement in which a number of electric terminals are led out independent of one another, as shown in FIG. 5, in addition to the filter arrangement in which the electric terminals are led out in parallel or in series.

Referring to FIG. 5, numerals 40, 42, 44, 46, 49, 51, 53 and 55 denote intermediate transducers inserted between the input transducers 39, 41, 43, 45 and 47 and the output transducers 48, 50, 52, 54 and 56 for connecting the input and the output transducers in series-parallel. It will be seen that also in the case of the intermediate transducers, the number of the interleaved electrodes or fingers is decreased for the transducers located toward the end of the array as compared with those located at or near the center. Numerals 57 and 58 denote input and output terminals respectively.

What is claimed is:

1. An acoustic surface-wave bandpass filter comprising a plurality of input transducers and a plurality of output transducers formed on a substrate and arrayed in the direction in which acoustic surface waves travel on said substrate, each of said input and output transducers having a plurality of interleaved metal electrodes, wherein the number of said interleaved metal electrodes of at least one of said input and output transducers is increased for the transducer located at the center portion of said array as compared with the transducers located at both end portions of said array.

2. An acoustic surface-wave bandpass filter according to claim 1, further including reflectors provided at both ends of said filter, respectively.

3. An acoustic surface-wave bandpass filter according to claim 1, further including a plurality of intermediate transducers for interconnecting said input transducers and said output transducers in serial-parallel connection.

4. An acoustic surface-wave bandpass filter according to claim 3, wherein the number of interleaved fingers of the intermediate transducers located at the center portion is determined to be greater than those of the intermediate transducers located at both end portions.

5. An acoustic surface-wave bandpass filter comprising a plurality of input transducers and a plurality of output transducers formed on a substrate and arrayed in the direction in which acoustic surface waves travel on said substrate, each of said input and output transducers having a plurality of interleaved metal electrodes, wherein the number of the electrodes of at least one of said transducers is determined such that it takes a maximum value at the center portion of the filter and monotonically decreases in the directions away from said center portion of the filter.

* * * * *